United States Patent
Rampold

(10) Patent No.: US 6,178,105 B1
(45) Date of Patent: Jan. 23, 2001

(54) CIRCUIT ARRANGEMENT FOR ACCURATELY DETECTING A DIRECT CURRENT DERIVED FROM CLOCKED ELECTRIC INPUT VALUES

(75) Inventor: Andreas Rampold, Mittweida (DE)

(73) Assignee: Siemens Aktiengesellschaft, Munich (DE)

(*) Notice: Under 35 U.S.C. 154(b), the term of this patent shall be extended for 0 days.

(21) Appl. No.: 09/322,974

(22) Filed: Jun. 1, 1999

Related U.S. Application Data

(63) Continuation of application No. PCT/DE97/02722, filed on Nov. 19, 1997.

(30) Foreign Application Priority Data

Dec. 2, 1996 (DE) .......................................... 296 20 919 U

(51) Int. Cl.$^7$ .................................................. H02M 7/00
(52) U.S. Cl. .............................................. 363/124; 363/39
(58) Field of Search .................................. 323/282, 286; 363/39, 124, 47

(56) References Cited

U.S. PATENT DOCUMENTS

| | | | |
|---|---|---|---|
| 4,967,101 | * 10/1990 | Nakamura et al. | 323/289 |
| 5,293,121 | 3/1994 | Estes, Jr. . | |
| 5,574,357 | * 11/1996 | Otake et al. | 363/127 |

FOREIGN PATENT DOCUMENTS

| | | |
|---|---|---|
| 2839190B1 | 11/1979 | (DE) . |
| 3337699A1 | 4/1985 | (DE) . |
| 276534A1 | 2/1990 | (DE) . |
| 4117505A1 | 12/1992 | (DE) . |
| 4430025A1 | 2/1996 | (DE) . |
| 0612141A2 | 8/1994 | (EP) . |
| 0636889 A1 | 2/1995 | (EP) . |

OTHER PUBLICATIONS

J. E. Herman et al., "A Method of Continuous Current Sensing In Switchmode Circuits," *Motorola Technical Developments*, vol. 7, Oct. 1987, pp. 60–61.

* cited by examiner

*Primary Examiner*—Peter S. Wong
*Assistant Examiner*—Gary L. Laxton
(74) *Attorney, Agent, or Firm*—Sughrue, Mion, Zinn, Macpeak & Seas, PLLC

(57) ABSTRACT

The apparatus is used for detecting an output direct current (Ia) produced by a pulse controller (PS). This pulse controller (PS) has at least one chopper device (Z) for forming a pulsed intermediate voltage (Up) and a pulsed intermediate current (Ip), which are converted by a smoothing device (GA) into an output DC voltage (Ua) and an output direct current (Ia). The apparatus includes a circuit (Ms) for electrically floating detection of the pulsed intermediate current (Ip) and for converting it into a pulsed measurement voltage (Us), and a switching device (Se) which is clocked by the pulsed intermediate voltage. This switching device (Se) supplies the pulsed measurement voltage (Us) in synchronism with the pulsed intermediate voltage to a low-pass filter (Tp), which produces a measurement DC voltage (Um3) that is proportional to the output direct current (Ia).

12 Claims, 4 Drawing Sheets

CIRCUIT ARRANGEMENT FOR ACCURATELY DETECTING A DIRECT CURRENT DERIVED FROM CLOCKED ELECTRIC INPUT VALUES

This is a Continuation of International application PCT/DE97/02722, with an international filing date of Nov. 19, 1997, the disclosure of which is incorporated into this application by reference.

FIELD OF AND BACKGROUND OF THE INVENTION

The invention relates to new and useful improvements in circuit arrangements for accurately detecting a direct current derived from clocked electric input values.

Current detection is normally carried out by first converting the current to a proportional voltage, prior to further processing. The traditional method for further evaluation is to evaluate the voltage drop caused by the current to be measured across a measurement resistor. However, as the current levels rise, this results in problems. Depending on the size of the measurement resistor used, this either leads to high power losses, or smaller measurement voltages must be used in order to limit the power loss. This, however, reduces the measurement accuracy.

In one special case, the direct current to be measured is derived from clocked electrical input variables. FIG. 1 shows the block diagram of a circuit suitable for this purpose, specifically a basic circuit of a so-called pulse controller PS which includes a chopper Z provided with an input DC voltage Ug. The chopper Z uses this to produce a pulsed intermediate voltage Up and a pulsed intermediate current Ip which has, for example, a trapezoidal waveform. The chopper Z is followed by a smoothing device GA for the intermediate voltage Up and for the intermediate current Ip, and this converts the pulsed variables to an output DC voltage Ua and an output direct current Ia. The chopper Z receives a predetermined nominal value Ua* for the actually desired magnitude of the output DC voltage Ua. This is essentially used to influence the frequency or pulse width of the intermediate voltage Up and the intermediate current Ip such that the intermediate voltage Up assumes a desired value.

FIG. 2 shows, inter alia, the basic circuit of a smoothing device GA in the pulse controller PS. This smoothing device GA has a smoothing inductor L with a freewheeling diode Vf, to which the pulsed intermediate voltage Up and the pulsed intermediate current Ip are supplied. The majority of the alternating component of this current is absorbed by a first smoothing capacitor Ca, so that a virtually pure DC voltage Ua is produced at the output of the circuit in FIG. 1, and the output direct current Ia corresponds to the mean current Il through the smoothing inductor L.

FIGS. 3A, 3B and 3C show the waveforms of the most important electrical signals in the circuit in FIG. 2. For example, FIG. 3A shows three pulses P1, P2, P3 from the waveform of the pulsed intermediate voltage Up at the circuit input. FIG. 3B shows the waveforms of the triangular current Il through the smoothing inductor, and of the output direct current Ia. The current Il through the smoothing inductor L is composed of two components. For the duration of each of the pulses P1, P2 and P3, the current Il corresponds to the waveform of the pulsed intermediate current Ip while, in the interims between the pulses, it corresponds to the trapezoidal current If through the freewheeling diode Vf.

The circuit in FIG. 2 also includes a component M1 which can be used to detect the present magnitude of the output direct current Ia, in a known manner. This first current measurement circuit M1 includes a first measurement resistor Rs1 through which the current passing through the smoothing inductor L flows and across which a first measurement DC voltage Um1 can be detected, as a measure of the magnitude of the output direct current Ia. The already mentioned drawback of considerable power losses in the measurement resistor Rs1 occurs with this circuit.

A second current measurement circuit M2, which is also illustrated in the circuit example in FIG. 2, uses a current transformer T to avoid virtually all the power losses in the measurement resistor. The transformation ratio of this current transformer T can be chosen to achieve a sufficiently large pulsed measurement current Im for virtually any given value of the pulsed intermediate current Ip. As a first component element, the current measurement circuit M2 includes a circuit Ms which is used to detect the pulsed intermediate current Ip and to convert it, as a floating potential, into a pulsed measurement current Im on the secondary of the current transformer T. The pulsed measurement current Im is passed to a first rectifier diode Vs and a second measurement resistor Rs2. The pulsed measurement voltage Us appears across this measurement resistor Rs2, which effectively forms the output of the current detection circuit Ms.

Since direct current cannot pass through the current transformer T, the measurement current Im for the second measurement resistor Rs2 is available only in pulsed form. To obtain a continuous measurement signal once again, a so-called peak-value detector Sg is provided downstream of the current transformer T. The circuit in FIG. 2 shows one example of such a peak-value detector Sg, comprising a second rectifier diode Vg and a parallel circuit formed by a damping resistor Rm and a second smoothing capacitor Cm. A second measurement DC voltage Um2 is thus available at the output of the second measurement circuit M2.

Even though this peak-value detector Sg produces a continuous measurement DC voltage Um2 from the pulsed measurement current Im, there is nonetheless an associated drawback. Specifically, this measurement DC voltage Um2 is only approximately proportional to the desired mean value of the current Ip or to the desired value of Ia. The accuracy of this measurement circuit M2 is also adversely affected by temperature-induced variations in the forward voltage of the second rectifier diode Vg. This will be explained in more detail in the following text with reference to the signal waveforms shown in FIG. 3C.

FIG. 3C shows the pulses of the pulsed measurement current Im which flows through the secondary of the current transformer T. This produces a pulsed measurement voltage Us across the second measurement resistor Rs2 at the output of the current detection circuit Ms. This is described by the relationship Us=Rs2*Im. An ideal peak-value detector would convert the pulsed measurement voltage Us into the measurement DC voltage Um*, whose magnitude would correspond to the peak value of the pulsed measurement voltage Us. However, in fact, owing to the non-ideal characteristics of the rectifier diode Vg in particular, a measurement DC voltage value Um2 is actually produced at the output of the peak-value detector Sg in FIG. 2.

OBJECTS OF THE INVENTION

It is therefore a first object of the invention to provide a measurement DC voltage whose magnitude corresponds to the mean value of the pulses of the measurement voltage Us in FIG. 3C. Such a measurement DC voltage is plotted in the form of the signal Um2z in FIG. 3C. Its value is proportional to the mean value of the pulsed measurement current Im during the pulses, and is proportional to the desired value of the output direct current Ia. The error between the output signal Um2 and the desired value Um2z corresponds to the measurement error of the circuit in FIG. 2.

It is a further object of the invention to provide a current measurement circuit of the type described above which is as simple as possible and which facilitates high-accuracy current measurement. In particular, it is sought to provide such a circuit without a resort to further magnetic components, for example current transformers.

SUMMARY OF THE INVENTION

According to one formulation of the invention, the present invention is directed to an apparatus for detecting an output direct current produced by a pulse controller. The pulse controller includes at least one chopper device forming a pulsed intermediate voltage and a pulsed intermediate current, which are converted by a smoothing device into an output DC voltage and into the output direct current. The detecting apparatus includes: a circuit which performs electrically floating detection and conversion of the pulsed intermediate current into a pulsed measurement voltage; a switching device which is clocked by the pulsed intermediate voltage and supplies the pulsed measurement voltage in time with the pulsed intermediate voltage; and a low-pass filter which filters the pulsed measurement voltage to produce a measurement DC voltage that is proportional to the output direct current.

BRIEF DESCRIPTION OF THE DRAWINGS

The invention and further advantageous refinements of the invention according to the features of the dependent claims are explained in more detail below with the aid of diagrammatic, exemplary embodiments in the drawing, in which:

FIGS. 3A–3C show waveforms, already explained above, of selected currents and voltages in the circuit shown in FIG. 2.

DETAILED DESCRIPTION OF THE PREFERRED EMBODIMENTS

Figure 1:
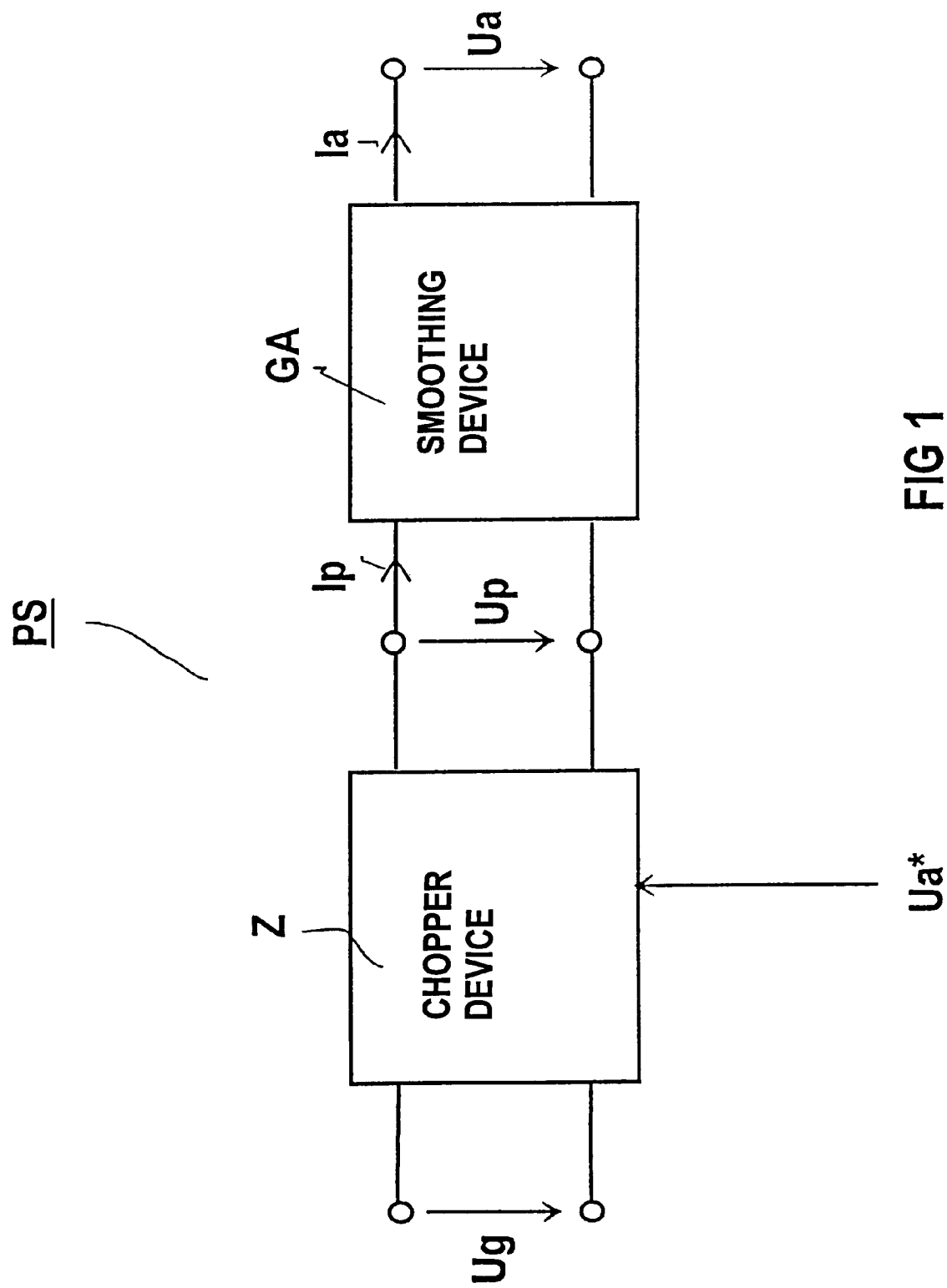
FIG. 1 shows the block diagram, already explained above, of an arrangement for producing variable output DC signals from an input DC voltage by means of pulsed intermediate signals.
Figure 2:
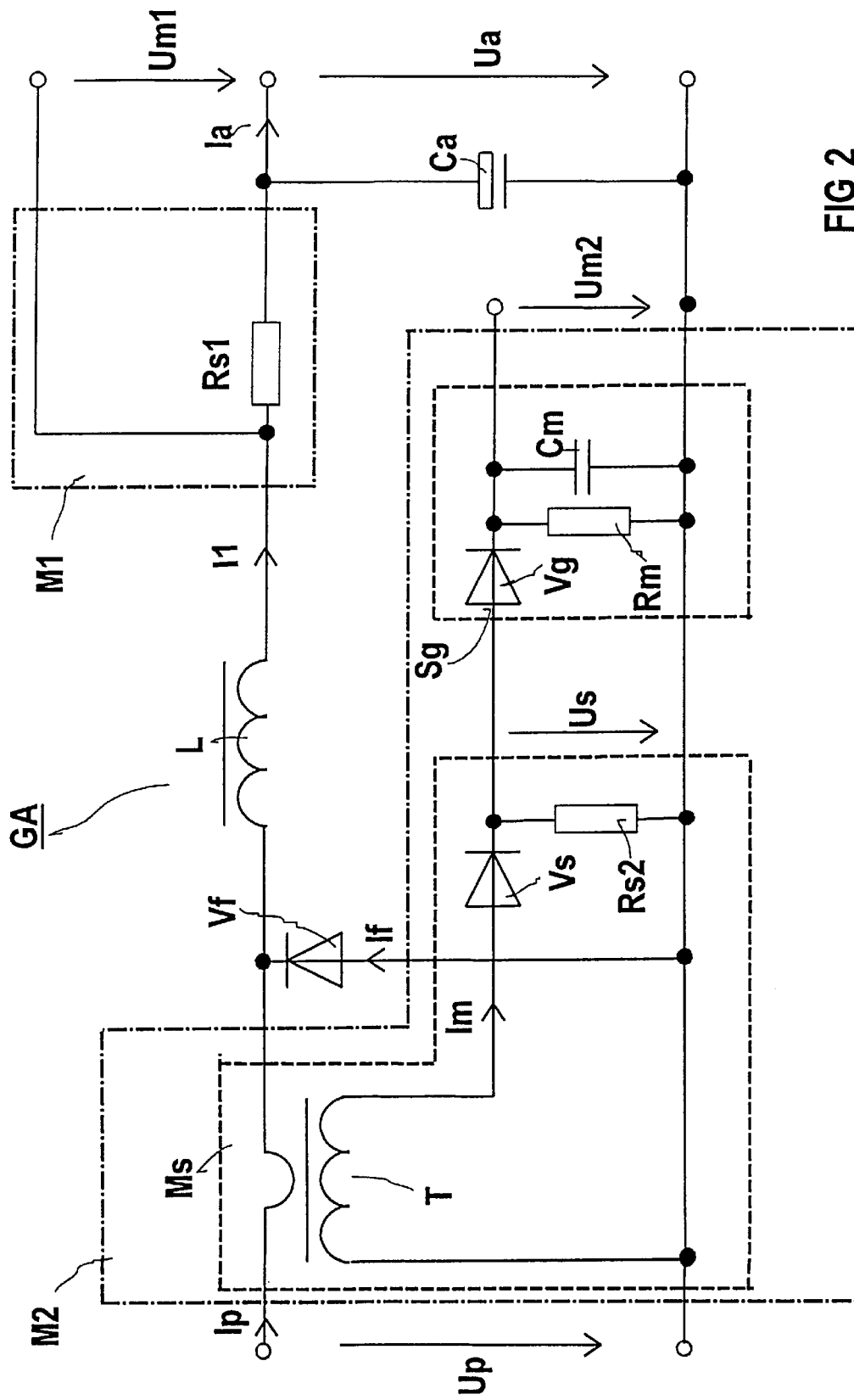
FIG. 2 shows a conventional circuit, already explained above, for rectification of a pulsed intermediate voltage, with two options for measuring the output direct current.
Figure 4:
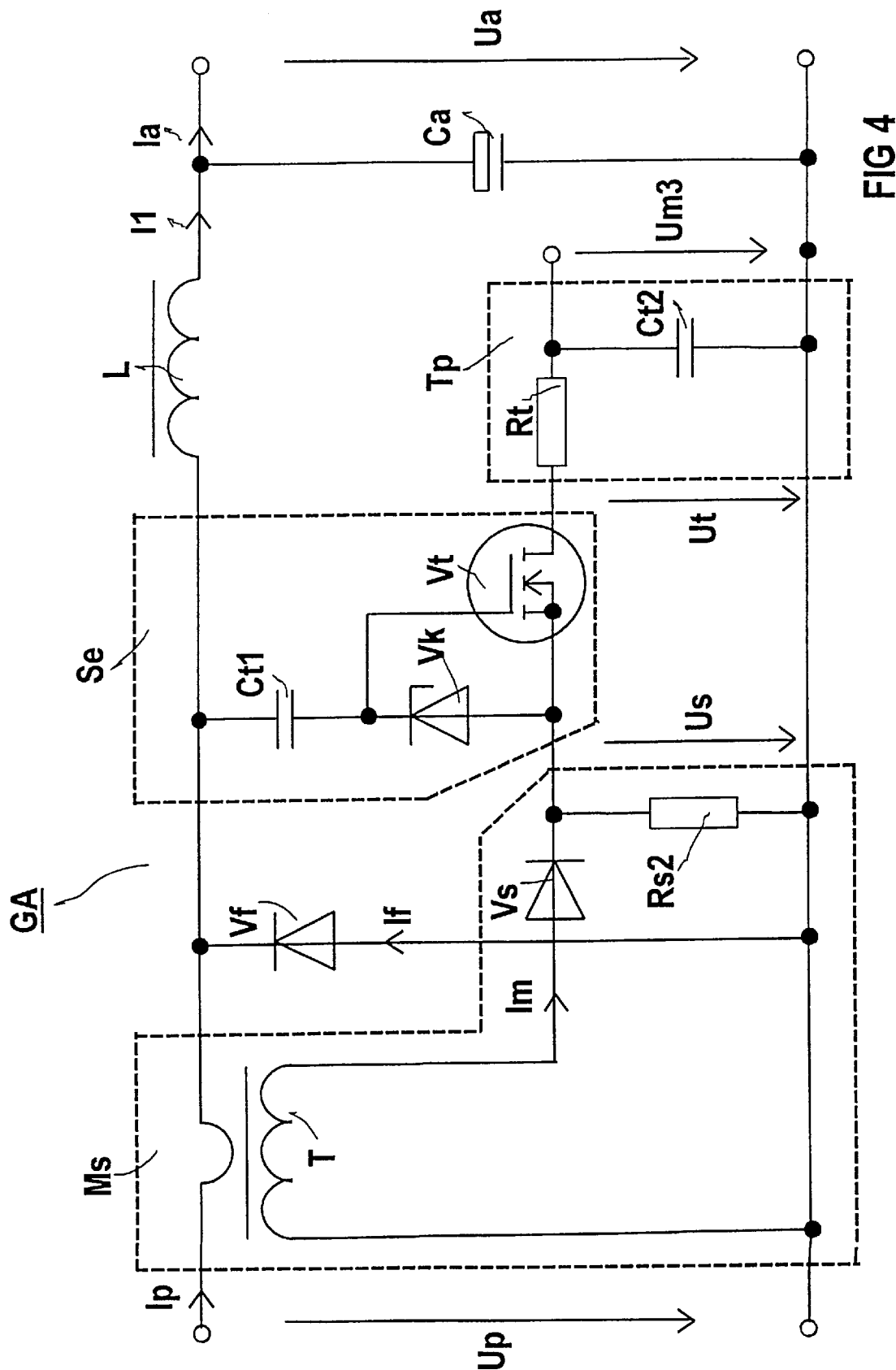
FIG. 4 shows a preferred embodiment of a refinement to the circuit shown in FIG. 2, according to the invention.

The following text, with reference to the circuit shown in FIG. 4, explains the basic principle of the apparatus according to the invention for detecting an output direct current Ia, produced by a pulse controller PS as shown in the illustration in FIG. 1. This figure shows a smoothing device GA in the pulse controller PS, whose basic circuit corresponds to the circuit shown in FIG. 2. For clarity, equivalent components and circuit parts in FIGS. 2 and 4 have the same reference symbols. The smoothing device of FIG. 4 is again supplied with a pulsed intermediate voltage Up, formed by a chopper device, and a pulsed intermediate current Ip, and these are used to form an output DC voltage Ua and an output direct current Ia. The present value of the output direct current Ia is intended to be measured.

To this end, the circuit shown in FIG. 4 has a circuit element Ms which is used for electrically floating detection of the pulsed intermediate current Ip and for converting the pulsed intermediate current Ip into a pulsed measurement voltage Us. This circuit element Ms is preferably designed to be the same as that shown in FIG. 2. According to the invention, the current detection circuit Ms is followed by a switching device Se which is clocked by the pulsed intermediate voltage Up. This switching device Se passes the pulsed measurement voltage Us to a low-pass filter Tp, in time with the pulsed intermediate voltage Up. The low-pass filter Tp, in turn, emits a measurement DC voltage Um3 which is proportional to the desired value of the output direct current Ia. A drive circuit for the clocked switching device Se preferably comprises a series circuit formed by a coupling capacitor Ct1 and a clamping diode Vk arranged between the potential of the pulsed intermediate voltage Up and the potential of the pulsed measurement voltage Us. The junction point between the coupling capacitor Ct1 and the clamping diode Vk is connected to the control electrode of an electronic switch Vt.

Figure 3D:
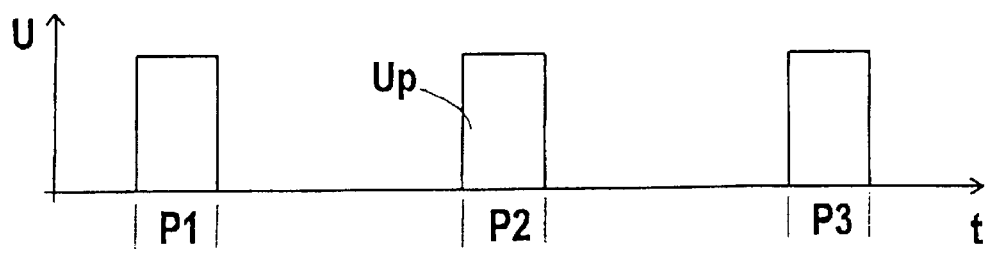
FIG. 3D shows, as a supplement to FIGS. 3A, 3B and 3C, the waveforms of selected voltages in the circuit shown in FIG. 4.
Figure 3D:
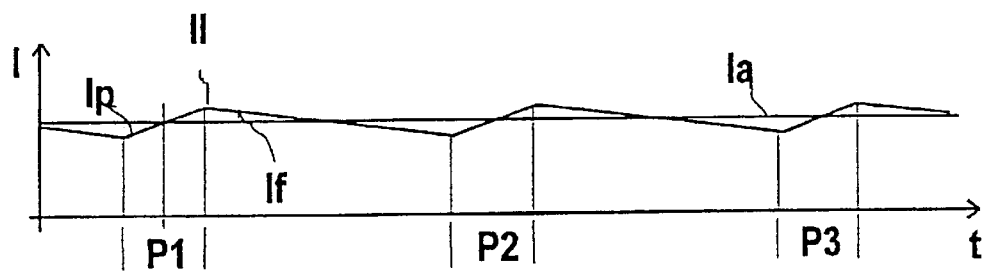
Figure 3D:
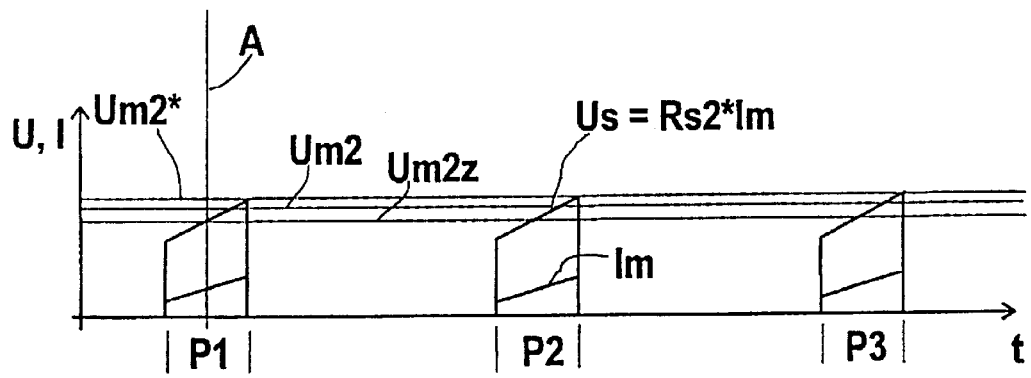
Figure 3D:
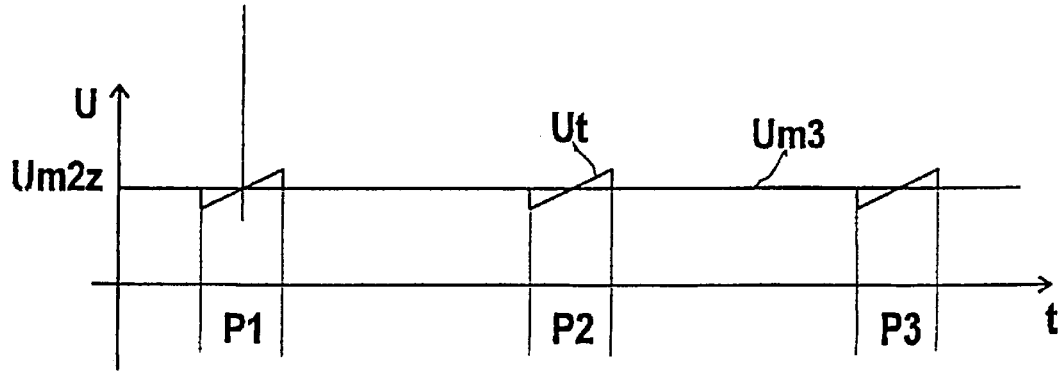

The low-pass filter Tp preferably includes at least one series resistor Rt and one filter capacitor Ct2. The clocked switching device Se is driven such that it always closes during the pulses of the intermediate current Ip. During this period, the low-pass filter Tp forms the mean value of the pulsed intermediate current Ip. During the interims between the Ip pulses, the clocked switching device Se remains open, and the filter capacitor Ct2 in the low-pass filter Tp retains the previously stored charge until the next current pulse. Assuming that the triangular waveform current Il in the smoothing inductor L (which, as already explained, is composed of the two current components Ip and If) rises approximately linearly during the period of a pulse of the clocked intermediate voltage Up (current component Ip) and falls again approximately linearly during the interims between the pulses (current component If), the same mean value occurs in the two phases. The low-pass filter Tp forms this mean value, as a third measurement voltage Um3, from the voltage Ut at the output of the clocked switching device Se. FIG. 3D shows both voltages Um3 and Ut. As a result of the connection of the clocked switching device Se, the voltage Ut corresponds, during each of the illustrated pulses P1, P2 and P3, to the waveform of the pulsed measurement voltage Us, and corresponds, in the durations between the pulses, to the mean value. This mean value is also produced during the pulses by the low-pass filter. The result is therefore a measurement DC voltage Um3 which corresponds to the ideal measured value Um2z, virtually without deviations. The mean value formed by the circuit shown in FIG. 4 thus corresponds to the desired value of the output direct current Ia. This can also be described by the following equation:

$$Ia = \frac{Um3}{\ddot{u}(T) * Rs2}$$

UM3: Voltage at the output of the low-pass filter Tp
ü(T): Transformation ratio of the current transformer T
Rs2: Resistance of the second measurement resistor
Ia: Output current It can be seen from the above equation that the accuracy of the measurement arrangement according to the invention now depends only on the quality of the measurement resistor Rs2. A precise actual value of the output direct current Ia can thus be obtained from the measurement DC voltage Um3 by using a high-precision measurement resistor Rs2.

It is particularly advantageous for the clocked switching device Se to be in the form of an electronic circuit. FIG. 4 shows an example of one simple configuration, using a MOS transistor Vt. The MOS transistor Vt is driven directly by the pulsed intermediate voltage Up. The required drive level for the transistor Vt can advantageously be tapped at the junction point of a series circuit formed by a coupling capacitor Ct1 and a clamping diode Vk. Together with the gate-source capacitance of the transistor Vt, the coupling capacitor Ct1 forms a capacitive voltage divider. As a result, the transistor Vt is switched on precisely during the pulses of the clocked intermediate voltage Up, i.e., when a pulse of the measurement current Im is present on the second measurement resistor Rs2.

In a further embodiment of the invention, a higher-order low-pass filter Tp can also advantageously be connected downstream of the electronic switch Vt. This allows the measurement accuracy of the circuit to be improved even further.

The above description of the preferred embodiments has been given by way of example. From the disclosure given, those skilled in the art will not only understand the present invention and its attendant advantages, but will also find apparent various changes and modifications to the structures disclosed. It is sought, therefore, to cover all such changes and modifications as fall within the spirit and scope of the invention, as defined by the appended claims, and equivalents thereof.

What is claimed is:

1. An apparatus for detecting an output direct current produced by a pulse controller, wherein the pulse controller comprises at least one chopper device forming a pulsed intermediate voltage and a pulsed intermediate current, which are converted by a smoothing device into an output DC voltage and into the output direct current, said apparatus comprising:
   a circuit which performs electrically floating detection and conversion of the pulsed intermediate current into a pulsed measurement voltage;
   a switching device which is clocked by the pulsed intermediate voltage and supplies the pulsed measurement voltage in time with the pulsed intermediate voltage; and
   a low-pass filter which filters the pulsed measurement voltage to produce a measurement DC voltage that is proportional to the output direct current.

2. The apparatus as claimed in claim 1, wherein said circuit comprises:
   a current transformer which converts the pulsed intermediate current to a pulsed measurement current.

3. The apparatus as claimed in claim 2, wherein said circuit further comprises:
   a first rectifier diode and a measurement resistor which convert the pulsed measurement current to the pulsed measurement voltage.

4. The apparatus as claimed in claim 1, wherein said switching device comprises:
   an electronic switch which is clocked by the pulsed intermediate voltage through a drive circuit.

5. The apparatus as claimed in claim 1, wherein said electronic switch comprises a MOS transistor.

6. The apparatus as claimed in claim 4, wherein said drive circuit comprises:
   a series circuit which is arranged between the potential of the pulsed intermediate voltage and the potential of the pulsed measurement voltage and which comprises a coupling capacitor and a clamping diode,
   wherein a junction point between said coupling capacitor and said clamping diode is connected to a control electrode of said electronic switch.

7. The apparatus as claimed in claim 1, wherein said low-pass filter comprises:
   at least one series-connected resistor, and
   a filter capacitor, across which the measurement DC voltage is produced.

8. A pulse generator comprising:
   a chopper outputting a pulsed intermediate voltage and a pulsed intermediate current;
   conversion circuitry converting the pulsed intermediate voltage and the pulsed intermediate current into a pulsed measurement voltage and an output direct current;
   a switching device clocked by the pulsed intermediate voltage and supplying the pulsed measurement voltage in synchronism with the pulsed intermediate voltage; and
   a low-pass filter producing a measurement DC voltage, proportional to the output direct current, from the pulsed measurement voltage.

9. The pulse generator according to claim 8, wherein said conversion circuitry comprises:
   a current transformer arranged to convert the pulsed intermediate current to a pulsed measurement current;
   a first rectifier diode and a measurement resistor arranged to convert the pulsed measurement current to the pulsed measurement voltage; and
   a smoothing inductor, a freewheeling diode and a smoothing capacitor arranged to convert the pulsed intermediate voltage and the pulsed intermediate current to the output direct current and an output DC voltage.

10. The pulse generator according to claim 8, wherein said switching device comprises:
    a drive circuit comprising:
       a series circuit which is arranged between the potential of the pulsed intermediate voltage and the potential of the pulsed measurement voltage and which comprises a coupling capacitor and a clamping diode, and
       an electronic switch which is clocked by the pulsed intermediate voltage through said drive circuit,
    wherein a junction point between said coupling capacitor and said clamping diode is connected to a control electrode of said electronic switch.

11. The pulse generator according to claim 8, wherein said low-pass filter comprises:
    at least one series-connected resistor, and
    a filter capacitor, across which the measurement DC voltage is produced.

12. A smoothing device for converting a pulsed intermediate voltage and a pulsed intermediate current into an output DC voltage and an output direct current, comprising:
    conversion circuitry arranged to convert the pulsed intermediate voltage and the pulsed intermediate current into a pulsed measurement voltage and into the output direct current;
    a switching device clocked by the pulsed intermediate voltage and arranged to supply the pulsed measurement voltage in synchronism with the pulsed intermediate voltage; and
    a low-pass filter producing a measurement DC voltage, proportional to the output direct current, from the pulsed measurement voltage.

* * * * *